United States Patent
Beall et al.

(10) Patent No.: US 6,847,521 B2
(45) Date of Patent: Jan. 25, 2005

(54) PCB AS A STRUCTURAL COMPONENT AND INTERNAL CHASSIS ALIGNMENT

(75) Inventors: Christopher Beall, Pflugerville, TX (US); Laurent A. Regimbal, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 98 days.

(21) Appl. No.: 10/336,598

(22) Filed: Jan. 3, 2003

(65) Prior Publication Data

US 2004/0130861 A1 Jul. 8, 2004

(51) Int. Cl.$^7$ ................................................. G06F 1/16
(52) U.S. Cl. ...................... 361/682; 361/683; 361/816; 312/223.2
(58) Field of Search ................................. 361/682, 683, 361/679, 724–727, 803, 760, 788, 802; 312/223.2, 223.3, 223.1, 263, 265.5, 61, 607; 439/924.1; 174/35 R, 35 C; 206/706, 709, 711, 722, 725; 211/41.17

(56) References Cited

U.S. PATENT DOCUMENTS

| | | | |
|---|---|---|---|
| 4,846,699 A | * 7/1989 | Glover et al. | 439/64 |
| 4,969,066 A | * 11/1990 | Eibl et al. | 361/785 |
| 5,031,075 A | * 7/1991 | Casanova et al. | 361/802 |
| 5,602,717 A | * 2/1997 | Leshem et al. | 361/685 |
| 5,774,343 A | * 6/1998 | Benson et al. | 361/796 |
| 5,816,673 A | * 10/1998 | Sauer et al. | 312/223.2 |
| 6,058,025 A | * 5/2000 | Ecker et al. | 361/816 |
| 6,104,616 A | * 8/2000 | Benson, Jr. et al. | 361/724 |
| 6,208,522 B1 | 3/2001 | Manweiler et al. | |
| 6,325,636 B1 | 12/2001 | Hipp et al. | |
| 6,406,322 B1 | * 6/2002 | Barringer et al. | 439/377 |
| 6,459,589 B2 | 10/2002 | Manweiler et al. | |
| 6,485,309 B2 | 11/2002 | Edholm | |
| 6,528,737 B1 | 3/2003 | Kwong et al. | |
| 6,549,400 B1 | * 4/2003 | Medin et al. | 361/686 |

* cited by examiner

Primary Examiner—Michael Datskovsky
(74) Attorney, Agent, or Firm—Haynes and Boone, LLP (57) ABSTRACT

An information handling system includes a first module including first alignment members and a second module including second alignment members for engagement with the first alignment members. A PCB is retained on the first module to provide a structural member for the first module, to maintain dimensional accuracy of the first module, and to accurately position the first alignment members for alignment with the second alignment members.

20 Claims, 8 Drawing Sheets

PCB AS A STRUCTURAL COMPONENT AND INTERNAL CHASSIS ALIGNMENT

BACKGROUND

The present disclosure relates generally to information handling systems, and more particularly to using a circuit board for structural support and alignment in a computer chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In computer chassis a PCB is used to provide electrical interconnection between modules. Often, it is advantageous to provide access to the PCB when the computer chassis is rack mounted. The chassis modules are constructed of sheet metal and house various components of the computer.

One specific embodiment includes a sub-chassis and a main chassis combination interconnected by a midplane PCB.

Due to the fact that computer chassis are becoming more densely populated, the need for electrical space becomes more critical and mechanical structure is often sacrificed.

As a result, the sub-chassis module is structurally rather weak when not installed in the main chassis module. Due to the lack of structural strength, the sub-chassis module can deform vertically and/or horizontally and in some cases can resemble a parallelogram in cross-section rather than a rectangle.

This can produce alignment problems when the sub-chassis module is installed into the main chassis module, due to the fact that features in the main chassis, sub-chassis and midplane must be properly aligned, e.g. connectors.

It is known that PCBs are weak in bending but resist tensile and compression loads. It is therefore more important to support the PCB in bending than in tension or compression. In the past, no single feature in a PCB has been used to guide multiple modules of a product. Instead, products use connector guide features to align different modules. Tolerances can build up quickly through this type of alignment method. This tolerance buildup can add substantial stress or misalignment to connections which may result in bent or damaged connector pins.

As a result, there is a need for providing structural strength to the sub-chassis module and an added need for locating and alignment features which accurately join the main chassis module, the midplane and the sub-chassis module.

SUMMARY

One embodiment, accordingly, includes an information handling system having a first module including first alignment members and a second module including second alignment members for engagement with the first alignment members. A PCB is retained on the first module to provide a structural member for the first module, to maintain dimensional accuracy of the first module and to accurately position the first alignment members for alignment with the second alignment members.

Therefore, this embodiment provides a system for aligning, strengthening and providing dimensional accuracy to a module which is to be connected to a supplementary module.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
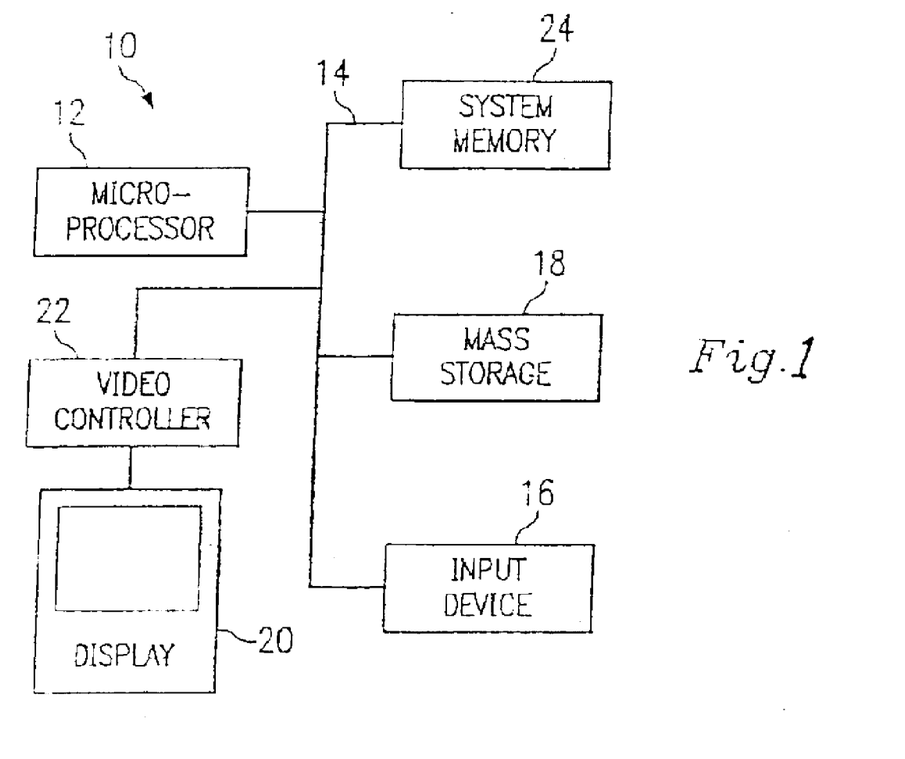
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
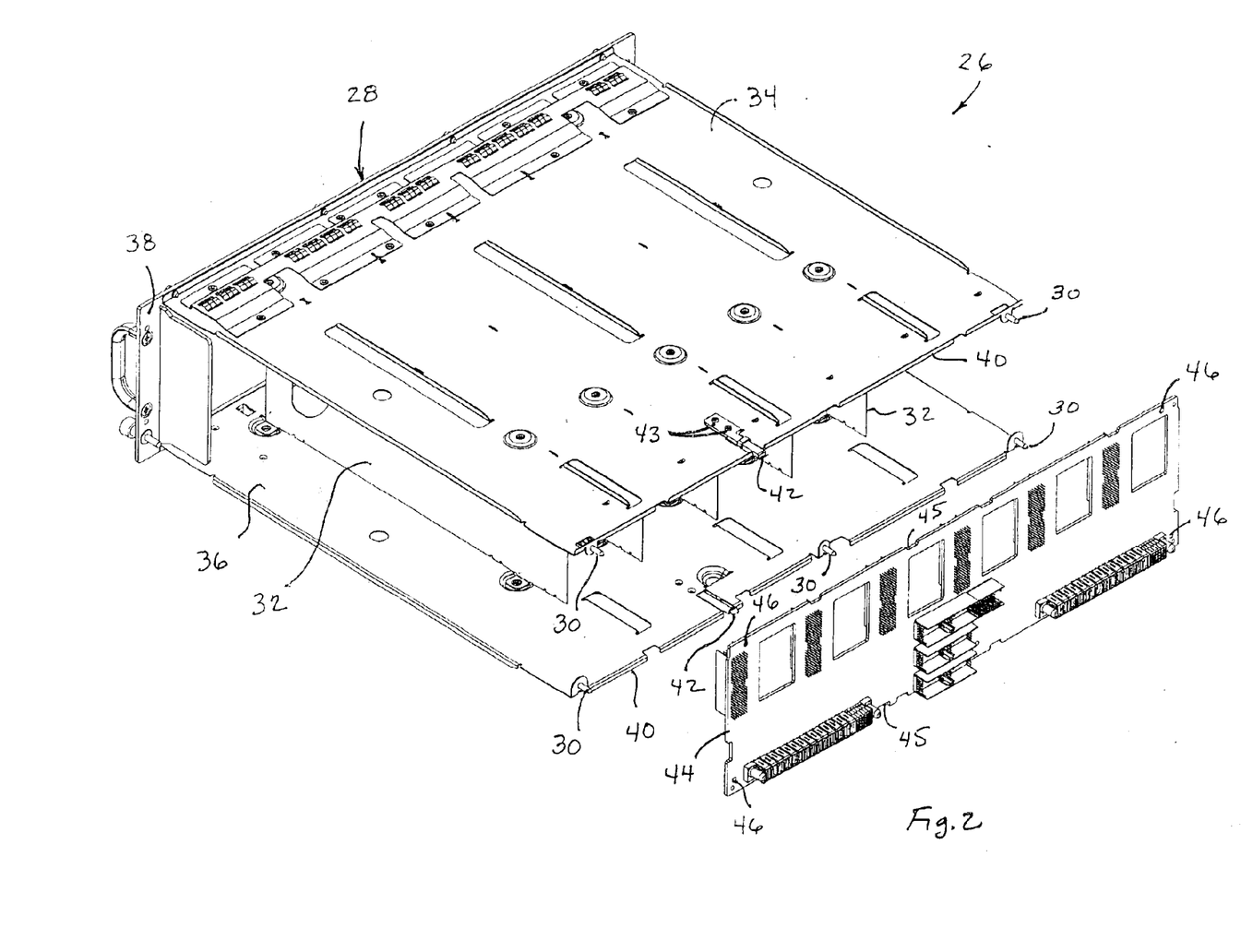
FIG. 2 is a perspective view illustrating an embodiment of a first module.

In a specific embodiment, a chassis assembly 26, FIG. 2, includes a first module 28 including a plurality of first alignment members 30 such as alignment pins, multiple structural walls 32, an upper plate 34, a lower plate 36, and a face plate 38. Each of the upper and lower plates 34, 36, include a reinforced lip edge 40. Also, each of the upper and lower plates 34, 36 include flexible, resilient leaf springs 42 extending therefrom and retained thereon by fasteners 43. As viewed in FIG. 2, first module 28 is vertically and horizontally deformable and thus unstable. As a result, there is no reliable dimensional accuracy provided for the alignment members 30. A PCB 44 includes a plurality of slots 44 and receivers 46 for attachment to module 28, as will be described below.

Figure 3:
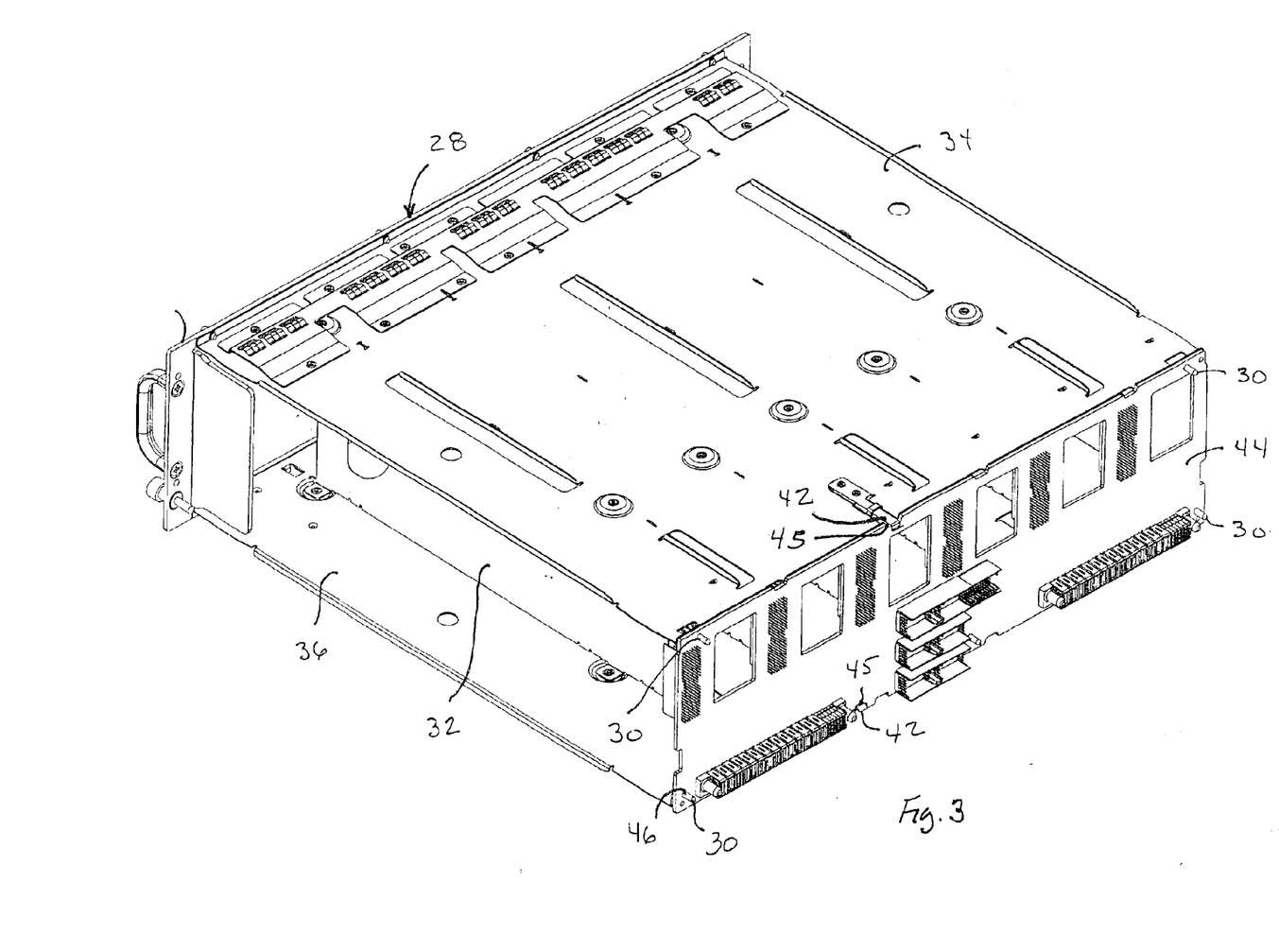
FIG. 3 is a perspective view illustrating an embodiment of the first module attached to a PCB.

In order to strengthen the first module 28 and provide stability and dimensional accuracy, PCB 44, FIG. 3, is retained on the first module 28 to provide a structural member, thus accurately positioning the first alignment members 30. The PCB 44 is retained on the first module 28 by means of the plurality of receivers 46 formed in PCB 44 which are alignable for receiving alignment members 30. Also, the leaf springs 42 engage the plurality of respective grooves 45 provided in the PCB 44 in a snap-lock manner. As such, the PCB 44 is mounted on the first module 28 by simultaneously inserting each alignment member 30 into a respective receiver 46, and fully seating the PCB 44 against the lip edges 40. The leaf springs 42 retain PCB 44 on the first module 28. The stabilized first module 28 is strengthened and structurally stable, and the first alignment members 30 are dimensionally accurate. FIG. 3 illustrates PCB 44 mounted on module 28 as described.

Figure 4:
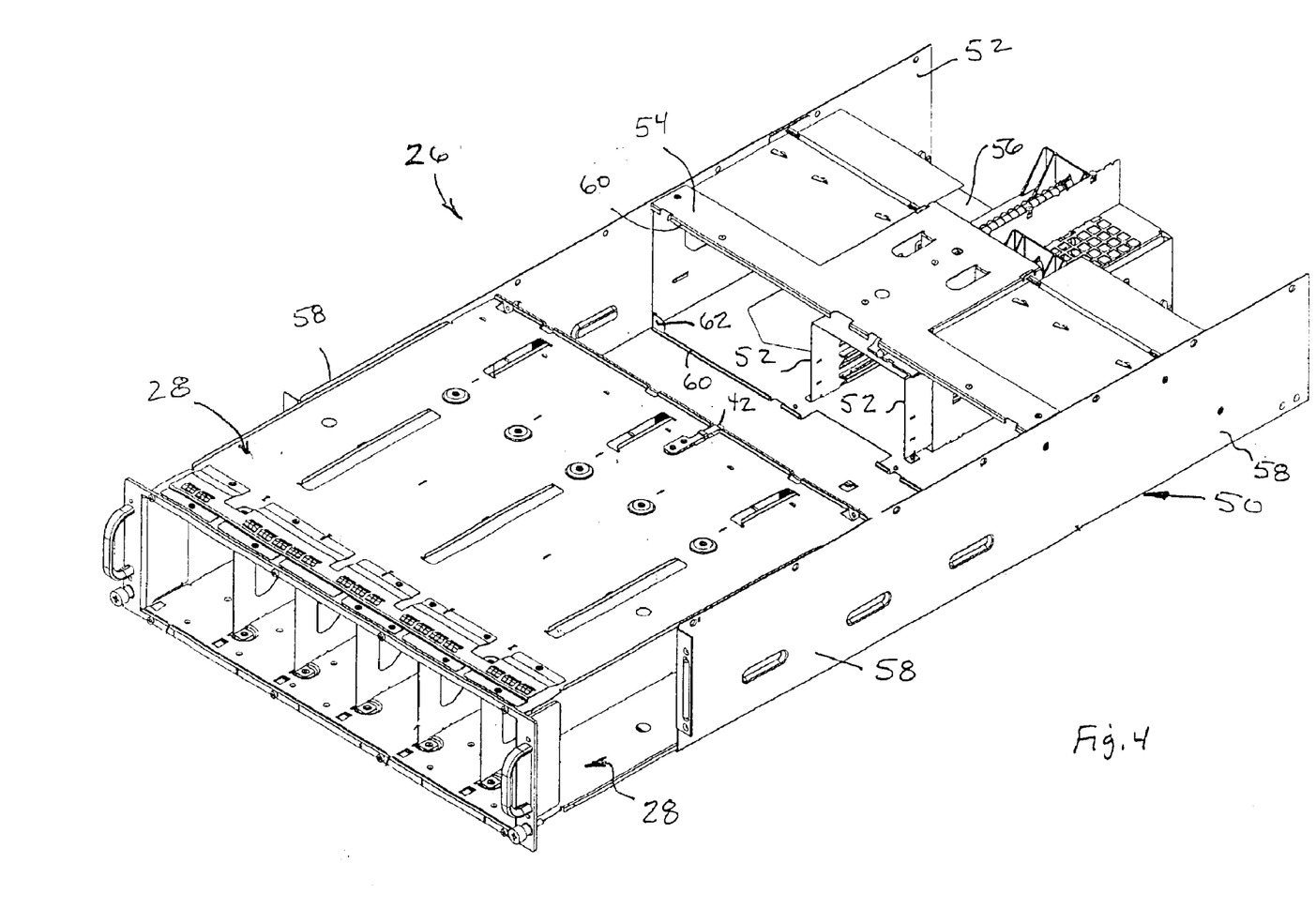
FIG. 4 is a perspective view illustrating an embodiment of a module assembly including the first module and a second module.

In FIG. 4, with PCB 44 mounted on module 28 as described above, first module 28 is mounted in a second module 50 which includes elongated multiple structural walls 58, inner walls 52, an upper plate 54 and a lower plate 56. Each of the upper and lower plates 54, 56, include a reinforced lip edge 60. Walls 58 slidably receive first module 28, to form assembly 26. A plurality of pin receivers 62, (only one of which is visible in FIG. 4) are provided on second module 50 to receive alignment pins 30 (only one of which is visible in FIG. 4) which extend from first module 28 and through PCB 44 as described above. Alignment of pins 30 and receivers 62 is assured due to the dimensional accuracy of pins 30 provided by PCB 44 as described above. Only an edge of PCB 44 is visible in FIG. 4, nested against lip edge 40.

Figure 5:
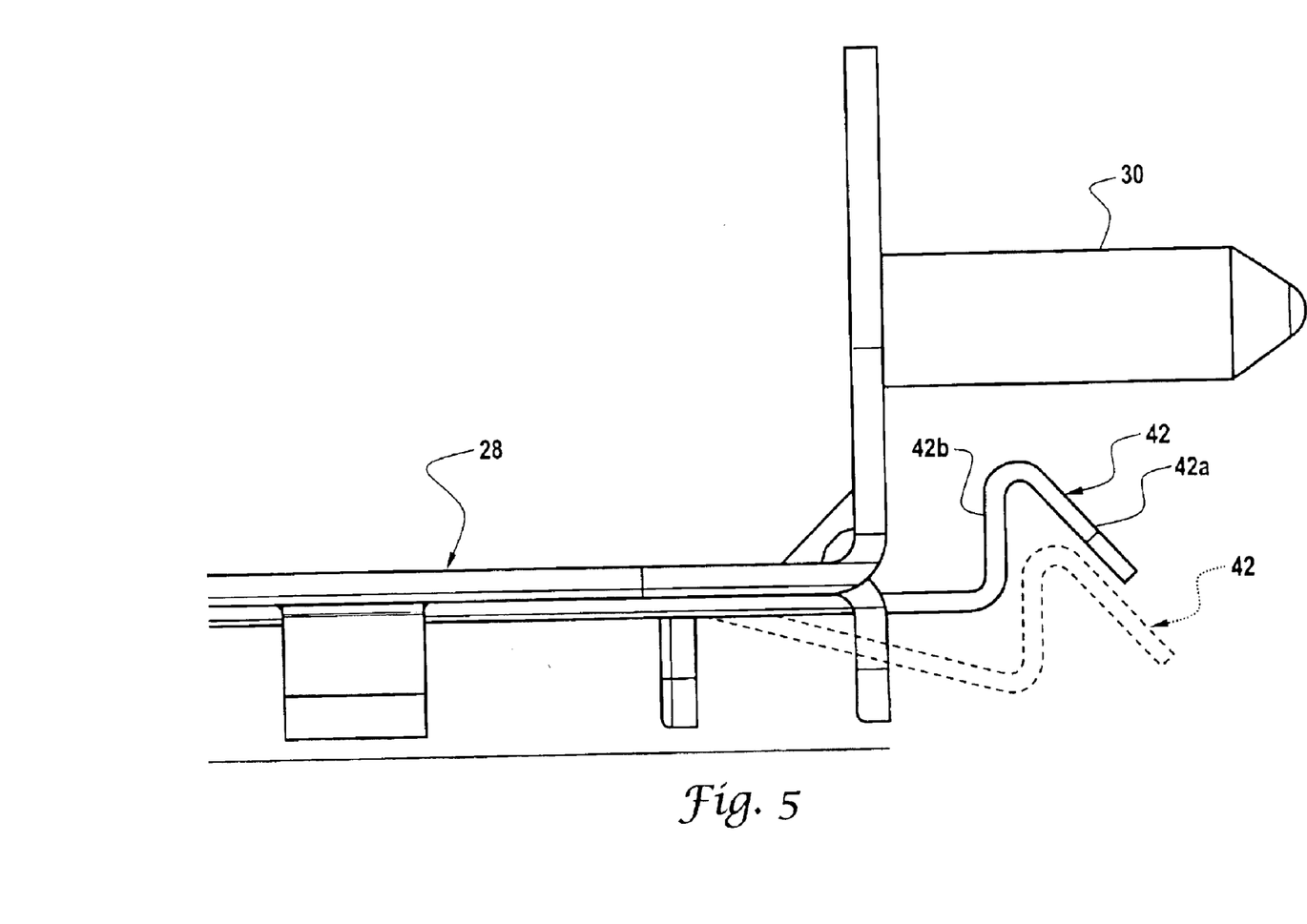
FIGS. 5–7 are partial side views illustrating an embodiment of module alignment and PCB attachment.
Figure 6:
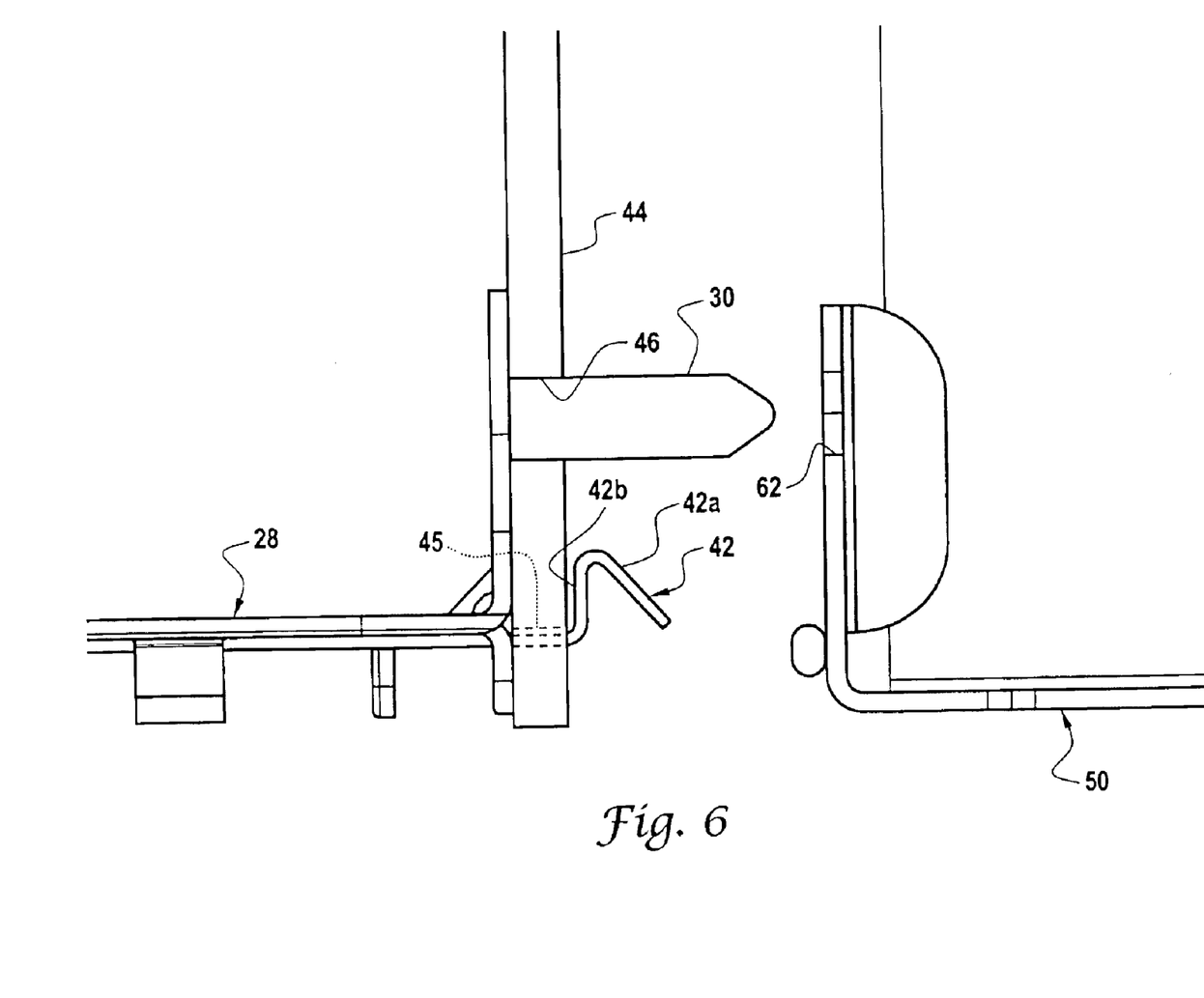

More specifically, the first module 28, FIG. 5, includes a combination of mounting members including the alignment pins 30 and the resilient leaf spring members 42, including a ramp 42a and a flange 42b. Alignment pins 30, FIG. 6, of first module 28 are inserted through the alignment pin receivers 46 in PCB 44 until the resilient members 42 snap-lock into engagement with groove 45 in the PCB 44. This occurs when ramp 42a of resilient members 42 deflects upon contact with the PCB 44, and then flange 42b snaps into a locking position when PCB 44 is fully seated on pins 30. The alignment pins 30 are thus dimensionally accurate for alignment with receivers 62 of second module 50.

Figure 7:
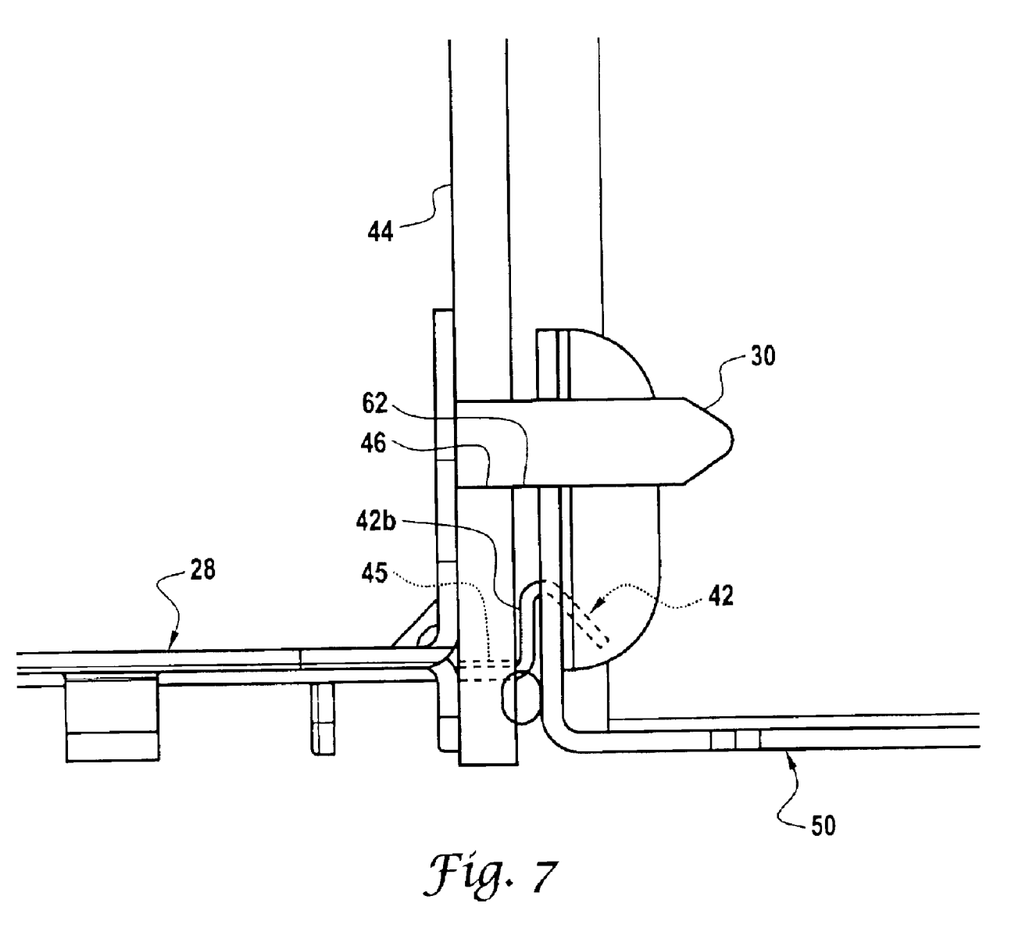

Alignment pins 30, FIG. 7, extend through recess 46 in PCB 44 engaged by flange 42b of member 42 which is snapped into groove 45. The first module 28 is then slidably inserted into the second module 50 until alignment pins 30 of first module 28 extend into the alignment pin receivers 62 of second module 50. The resilient members 42 are attached to first module 28 in cantilever fashion. This creates the desired leaf spring effect.

Figure 8:
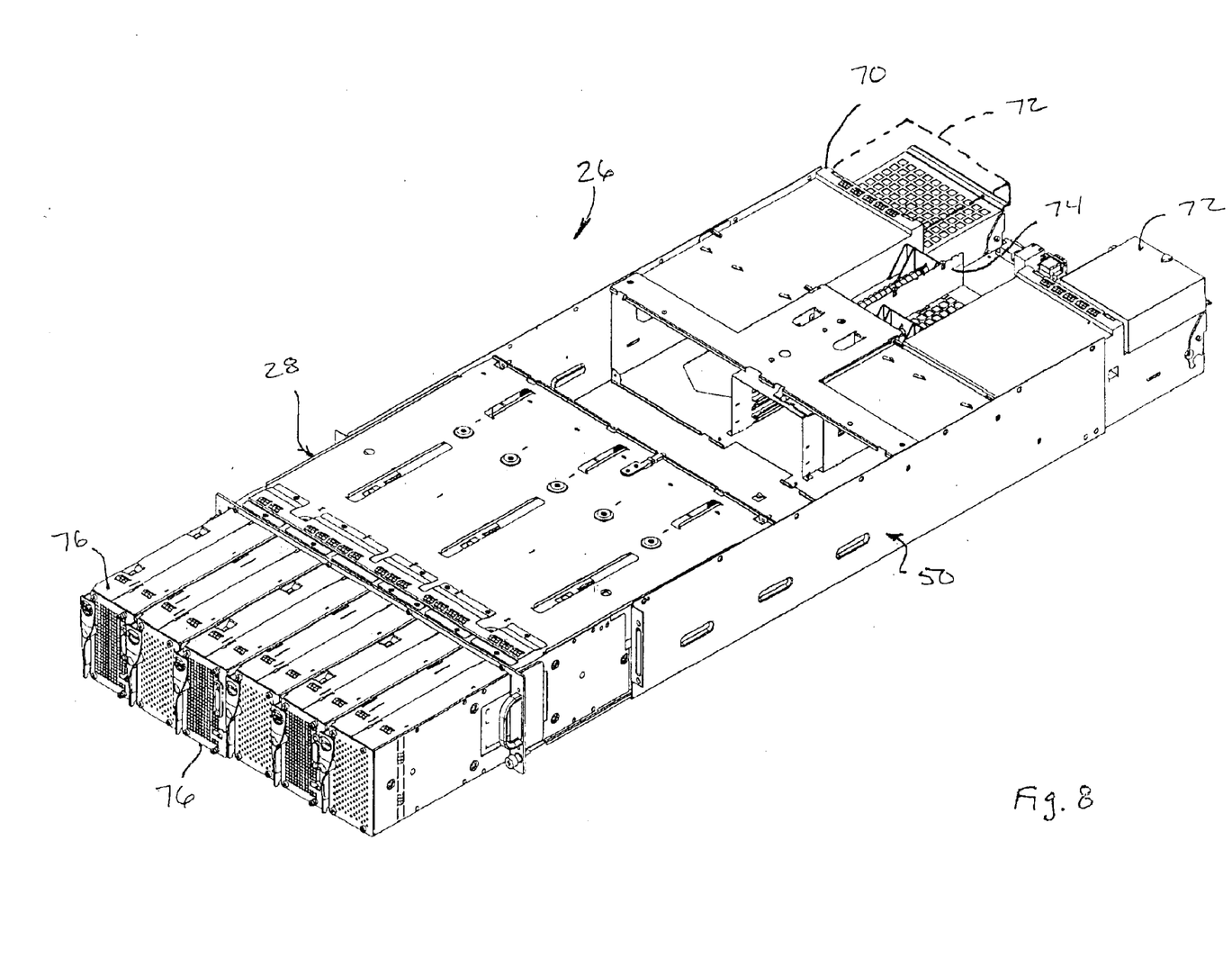
FIG. 8 is a perspective view illustrating an embodiment of the module assembly including components.

The chassis assembly 26, FIG. 8, includes a first end 70 containing power supplies 72 and input/output (I/O) cards 74. The first module 28 carries a plurality of blades 76 (or unique servers). Each blade 76 contains a computer system including at least some of the components of system 10, as described above in FIG. 1. The blades 76 are plugged in to PCB 44. The PCB 44, positioned against lip edge 40, interconnects the blades 76 and connects them to the network served by the chassis assembly 26.

In the present device, the PCB solution revolves around guide pins and snap springs. By placing guide pins on the front module, the front module can line up with the PCB by means of tightly controlled holes in the PCB. By using tabs with tightly controlled holes in the main chassis, the same guide pins can align the main chassis to the front chassis, and to the PCB.

The front module has a lip along the edge on the top and bottom along the entire back of the cage. The PCB is squeezed between lip edges of the modules, when the module is screwed into the main chassis in the front of the system, so that the PCB cannot move.

The foregoing illustrates keeping the front module from parallelograming. This involves a plurality guide pins instead of the screws. However, without the screws, the PCB uses snap springs to hold the PCB on the guide pins until the front module is installed into the common chassis. By using this solution, the PCB functions as a structural member to keep the front module from parallelograming, and to create a much stronger front module that self aligns into the common or main chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An information handling system comprising:
   a first module including first alignment members;
   a second module including second alignment members for engagement with the first alignment members;
   a PCB retained on the first module to provide an endplate member for the first module, to maintain dimensional accuracy of the first module, and to accurately position the first alignment members for alignment with the second alignment members; and
   a plurality of resilient members for retaining the PCB on the first alignment members.

2. The system as defined in claim 1 wherein the first alignment members include a plurality of alignment pins.

3. The system as defined in claim 2 wherein the PCB is mounted on the first module by receiving the alignment pins to maintain dimensional accuracy of the first module.

4. The system as defined in claim 1 wherein the resilient members include leaf springs for snap-locking engagement with the PCB.

5. The system as defined in claim 3 wherein the second alignment members are dimensionally accurately aligned to receive the alignment pins extending through the PCB.

6. The system as defined in claim 3 wherein the PCB is a stabilizing endplate member of the first module for limiting vertical and horizontal deformation of the first module.

7. The system as defined in claim 5 wherein the first module is slidably inserted into the second module.

8. The system as defined in claim 7 wherein the PCB is engaged and retained between a lip edge of the first module and a lip edge of the second module when the first alignment members are seated in the second alignment members.

9. An information handling system comprising:
- a chassis assembly including a first module and a second module having multiple structural walls;
- a microprocessor mounted in the chassis assembly;
- a storage coupled to the microprocessor;
- a PCB member being an endwall of the chassis assembly, the PCB being mounted on the chassis assembly by a plurality of mounting members including alignment members which extend through the PCB; and
- a plurality of resilient members for retaining the PCB on the first alignment members.

10. The system as defined in claim 9 wherein the a plurality of first alignment members include a plurality of alignment pins.

11. The system as defined in claim 10 wherein the PCB is mounted on the first module by receiving the alignment pins to maintain dimensional accuracy of the first module.

12. The system as defined in claim 9 wherein the resilient members include leaf springs for snap-locking engagement with the PCB.

13. The system as defined in claim 11 wherein the a plurality of second alignment members are dimensionally accurately aligned to receive the alignment pins extending through the PCB.

14. The system as defined in claim 11 wherein the PCB is a stabilizing endwall of the first module for limiting vertical and horizontal deformation of the first module.

15. The system as defined in claim 13 wherein the first module is slidably inserted into the second module.

16. The system as defined in claim 14 wherein the PCB is engaged and retained between a lip edge of the first module and a lip edge of the second module when the first alignment members are seated in the second alignment members.

17. A method for structuring an information handling system comprising:

forming a first module being structurally incomplete and including first alignment members;

forming a second module including second alignment members having dimensional accuracy;

retaining a PCB on the first module for providing an endplate member for the first module, for maintaining dimensional accuracy of the first module, and for accurately positioning the first alignment members for alignment with the second alignment members; and providing a plurality of resilient members for retaining the PCB on the first alignment members.

18. The method as defined in claim 17 further comprising:

providing a plurality of alignment pins as the first alignment members; and mounting the PCB on the first module by extending the alignment pins through receivers provided in the PCB to structurally complete the first module and to maintain dimensional accuracy of the first module, whereby the second alignment members are dimensionally accurately aligned to receive the pins extending through the PCB.

19. A chassis assembly comprising:
- a first module including first alignment members;
- a second module receiving the first module and including second alignment members for engagement with the first alignment members;
- a PCB retained on the first module to provide an endplate member for the first module, to maintain dimensional accuracy of the first module, and to accurately position the first alignment members for alignment with the second alignment members; and
- a plurality of resilient members for retaining the PCB on the first alignment members.

20. A computer chassis assembly comprising:
- a chassis assembly having a first module inserted into a second module, the assembly including multiple structural walls;
- a microprocessor mounted in the chassis assembly;
- a storage coupled to the microprocesser; and
- a PCB member being an endwall of the chassis assembly, the PCB being mounted on the chassis assembly by a plurality of mounting members including alignment members which extend through the PCB; and
- a plurality of resilient members for retaining the PCB on the first alignment members.

* * * * *

UNITED STATES PATENT AND TRADEMARK OFFICE
CERTIFICATE OF CORRECTION

| | | |
|---|---|---|
| PATENT NO. | : 6,847,521 B2 | |
| APPLICATION NO. | : 10/336598 | |
| DATED | : January 25, 2005 | |
| INVENTOR(S) | : Beall et al. | |

It is certified that error appears in the above-identified patent and that said Letters Patent is hereby corrected as shown below:

The title page showing the illustrative figure should be deleted to be replaced with the attached title page.

The drawing sheets, consisting of Figs. 1,2,3,4, and 8, should be deleted to be replaced with the drawing sheets, consisting of Figs. 1,2,3,4, and 8, as shown on the attached pages.

Signed and Sealed this

Ninth Day of June, 2009

JOHN DOLL
*Acting Director of the United States Patent and Trademark Office*

(12) United States Patent
Beall et al.

(10) Patent No.: US 6,847,521 B2
(45) Date of Patent: Jan. 25, 2005

(54) PCB AS A STRUCTURAL COMPONENT AND INTERNAL CHASSIS ALIGNMENT

(75) Inventors: Christopher Beall, Pflugerville, TX (US); Laurent A. Regimbal, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 98 days.

(21) Appl. No.: 10/336,598

(22) Filed: Jan. 3, 2003

(65) Prior Publication Data
US 2004/0130861 A1 Jul. 8, 2004

(51) Int. Cl.⁷ .................................................. G06F 1/16
(52) U.S. Cl. ................... 361/682; 361/683; 361/816; 312/223.2
(58) Field of Search .................... 361/682, 683, 361/679, 724–727, 803, 760, 788, 802; 312/223.2, 223.3, 223.1, 263, 265.5, 61, 607; 439/924.1; 174/35 R, 35 C; 206/706, 709, 711, 722, 725; 211/41.17

(56) References Cited
U.S. PATENT DOCUMENTS

| | | | | |
|---|---|---|---|---|
| 4,846,699 A | * | 7/1989 | Glover et al. | 439/64 |
| 4,969,066 A | * | 11/1990 | Eibl et al. | 361/785 |
| 5,031,075 A | * | 7/1991 | Casanova et al. | 361/802 |
| 5,602,717 A | * | 2/1997 | Leshem et al. | 361/685 |
| 5,774,343 A | * | 6/1998 | Benson et al. | 361/796 |
| 5,816,673 A | * | 10/1998 | Sauer et al. | 312/223.2 |
| 6,058,025 A | * | 5/2000 | Ecker et al. | 361/816 |
| 6,104,616 A | * | 8/2000 | Benson, Jr. et al. | 361/724 |
| 6,208,522 B1 | | 3/2001 | Manweiler et al. | |
| 6,325,636 B1 | | 12/2001 | Hipp et al. | |
| 6,406,322 B1 | * | 6/2002 | Barringer et al. | 439/377 |
| 6,459,589 B2 | | 10/2002 | Manweiler et al. | |
| 6,485,309 B2 | | 11/2002 | Edholm | |
| 6,528,737 B1 | | 3/2003 | Kwong et al. | |
| 6,549,400 B1 | * | 4/2003 | Medin et al. | 361/686 |

* cited by examiner

*Primary Examiner*—Michael Datskovsky
(74) *Attorney, Agent, or Firm*—Haynes and Boone, LLP (57) ABSTRACT

An information handling system includes a first module including first alignment members and a second module including second alignment members for engagement with the first alignment members. A PCB is retained on the first module to provide a structural member for the first module, to maintain dimensional accuracy of the first module, and to accurately position the first alignment members for alignment with the second alignment members.

20 Claims, 8 Drawing Sheets